United States Patent [19]
Ladebeck

[11] Patent Number: 5,994,903
[45] Date of Patent: Nov. 30, 1999

[54] MOBILE NUCLEAR MAGNETIC RESONANCE APPARATUS

[75] Inventor: Ralf Ladebeck, Erlangen, Germany

[73] Assignee: Siemens Aktiengesellschaft, Munich, Germany

[21] Appl. No.: 09/313,558

[22] Filed: May 14, 1999

[30] Foreign Application Priority Data

May 14, 1998 [DE] Germany .................. 198 21 739

[51] Int. Cl.$^6$ ...................................... G01V 3/00

[52] U.S. Cl. ........................................ 324/319; 324/318

[58] Field of Search ..................... 324/319, 318, 324/322, 300, 307, 309; 335/296, 299; 600/421, 422

[56] References Cited

U.S. PATENT DOCUMENTS

| | | | |
|---|---|---|---|
| 5,276,399 | 1/1994 | Kasten et al. | 324/319 |
| 5,309,106 | 5/1994 | Miyajima et al. | 324/318 |
| 5,488,339 | 1/1996 | Havens et al. | 324/319 |

FOREIGN PATENT DOCUMENTS 2 162 641  2/1986  United Kingdom .

*Primary Examiner*—Louis Arana
*Attorney, Agent, or Firm*—Hill & Simpson

[57] ABSTRACT

A mobile nuclear magnetic resonance apparatus has a shielding arrangement having at least one primary shielding coil and at least one auxiliary shielding coil that is activated at least during transport of the nuclear magnetic resonance apparatus. This allows shielding of the stray field during transport in a simple way while still allowing qualitatively good exposures to be produced.

10 Claims, 1 Drawing Sheet

MOBILE NUCLEAR MAGNETIC RESONANCE APPARATUS

BACKGROUND OF THE INVENTION

1. Field of the Invention

The present invention is directed to a mobile nuclear magnetic resonance apparatus having a shielding arrangement with at least one primary shielding coil.

2. Description of the Prior Art

Mobile nuclear magnetic resonance apparatuses of the above type are well-known and are mounted on, for example, a truck trailer for a mobile installation. The nuclear magnetic resonance apparatus is permanently installed in the cargo space of the truck. It must be assured during the transport of a mobile nuclear magnetic resonance apparatus that the stray field outside the vehicle is low (even close to the exterior of the vehicle). The stray field is that part of a magnetic field outside the patient tube that does not contribute to the imaging. The allowable limit value for the stray field currently amounts to 5 mT, so that heart pacemakers are not influenced.

In known mobile nuclear magnetic resonance apparatuses, the stray field is shielded by an active shielding of the magnet with primary shielding coils in combination with a passive flux return through non-removable iron plates. The primary shielding coils are arranged in the magnet and are dimensioned so that they do not influence the homogeneity volume. United Kingdom Patent 2 162 641 discloses primary shielding coils for reducing the basic magnetic field outside the examination volume in a mobile nuclear magnetic resonance apparatus. In order to assure the strong shielding of the magnet toward the outside required for the transport, a passive flux return must be undertaken in such a known mobile nuclear magnetic resonance apparatus. These shielding measures have the disadvantage that the field in the examination volume is disturbed even by the slightest movements of the iron plates, for example due vibrations or fluctuations in air pressure in the cargo space, and thus in the patient tube.

The quality of the exposures, which require a field homogeneity precision in the ppm range, is reduced due to these field instabilities.

SUMMARY OF THE INVENTION

An object of the present invention is to provide a mobile nuclear magnetic resonance apparatus of the type initially described which can be additionally shielded in a simple way during transport while still being able to produce qualitatively good exposures.

The object is inventively achieved in a mobile nuclear magnetic resonance apparatus having a shielding arrangement having at least one primary shielding coil, and at least one auxiliary shielding coil that is selectively activated at least during transport of the nuclear magnetic resonance apparatus.

In the following, the term "auxiliary shielding coil" is always used in the singular, even though the mobile nuclear magnetic resonance apparatus according to the inventive can have more than only a single auxiliary shielding coil.

In the inventive nuclear magnetic resonance apparatus, the auxiliary shielding coil is only activated during the time in which it is required. Generally, this is only during transport. When the vehicle that transports the mobile nuclear magnetic resonance apparatus is parked, the auxiliary shielding coil need not be activated, nor is an additional shielding by iron plates required since entry (access) to areas having a field strength of more than 5 mT can be prevented with simple lockout measures.

Since the auxiliary shielding coil can be shut off during the examination, the quality of the exposures is not degraded. Due to the deactivatability of the auxiliary shielding coil, care need not be exercised as to how the auxiliary shielding coil disturbs the basic field, which is also referred to as the main magnetic field. The shim of the magnet (or the shimming of the main field) is not influenced, by contrast to the known solution employing non-removable iron plates.

An adequate shielding during transport with simultaneously good quality of the exposures could also be realized with removable iron plates. Compared to the inventive solution, however, this is significantly more complicated.

The inventive mobile nuclear magnetic resonance apparatus requires no additional iron plates for the enhanced shielding during transport, these additional iron plates requiring a relatively large volume compared to their shielding effect and being capable of negatively influencing the imaging measurement. Thus, not only is the inventive nuclear magnetic resonance apparatus constructed relatively compact, but also it still supplies qualitatively good exposures. Further, the increased shielding demands for transport can be achieved unproblematically in a simple way.

Within the framework of the invention, the auxiliary shielding coil can be fashioned as a superconducting coil or can be composed of an electrically conductive material, preferably copper or aluminum. It is also possible to integrate radio-frequency shielding in the auxiliary shielding coil. A combination of these versions can also be meaningful in specific applications.

Given an embodiment according to claim 3, it is possible to reduce the field strength of the auxiliary shielding coil during the imaging measurement either to its full extent or reduced or to reduce it to zero.

The required electrical power depends on the needed shielding, as well as on the conductor set employed for the auxiliary shielding coil (weight) and on the geometry of the transport vehicle, or of the cargo space. Given a higher electrical power, the weight of the auxiliary shielding coil can be reduced. A simple estimate shows that approximately 4 kW power are required given 500 kg copper for the auxiliary shielding coil.

Because the auxiliary shielding coil only has to be activated during transport, the constant current flowing through the auxiliary shielding coil need not be regulated with extreme precision. A direct current source can be used for this purpose, thus the power pack and/or the generator can thus be correspondingly simply constructed.

The auxiliary shielding coil can be arranged at the outside circumferential surface of the magnet. This enables an especially compact structure of the mobile nuclear magnetic resonance apparatus.

In most cases, the mobile nuclear magnetic resonance apparatus is permanently arranged in a transport container of a transport vehicle, for example of a truck trailer. The auxiliary shielding coil thus can be integrated in the wall of the cargo space or can be arranged at the inside of the wall of the cargo space or the wall of the cargo space can be fashioned as auxiliary shielding coil.

DESCRIPTION OF THE PREFERRED EMBODIMENTS

Figure 1:
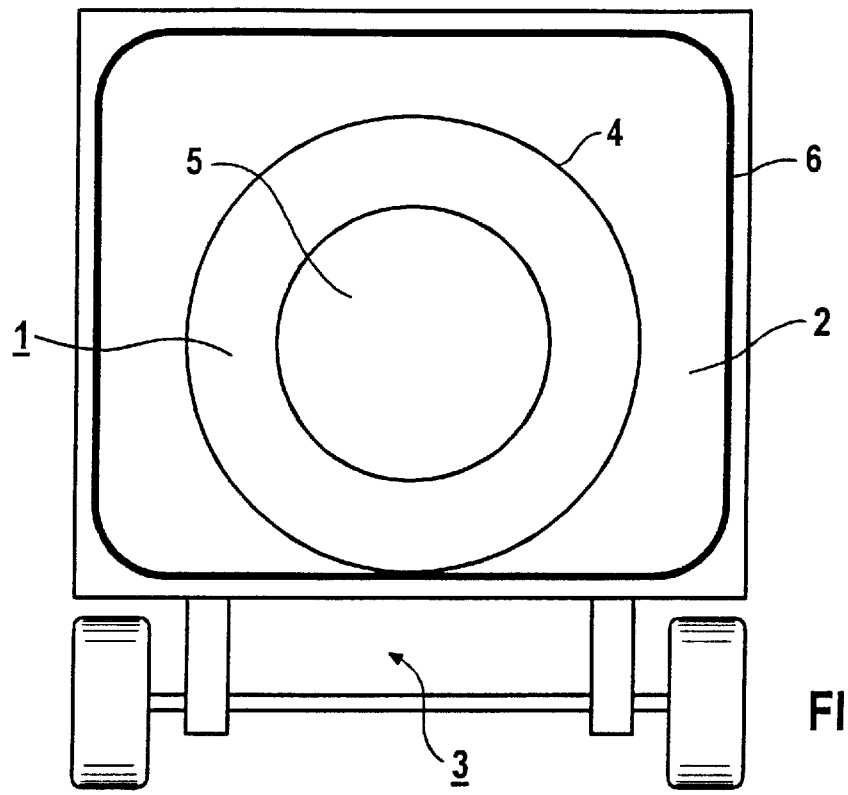
FIG. 1 is a cross section through a transport vehicle with a cargo space in which a nuclear magnetic resonance apparatus according to the invention is arranged.

FIG. 1 shows a nuclear magnetic resonance apparatus, which is mobile by virtue of a permanent arrangement in a cargo space 2 of a truck 3.

For clarity, only the magnet 4 of this nuclear magnetic resonance apparatus 1 is shown. Further components of the nuclear magnetic resonance apparatus 1 and of the magnet 4 are not shown in FIG. 1.

The magnet 4 of the nuclear magnetic resonance apparatus 1 has a patient tube 5 in which a patient lies while being examined.

The nuclear magnetic resonance apparatus 1 inventively has at least one auxiliary shielding coil 6 that is activated at least during transport of the nuclear magnetic resonance apparatus 1. The auxiliary shielding coil 6 is a component of a shielding arrangement (not shown in FIG. 1) that includes at least one primary shielding coil.

In the exemplary embodiment shown in FIG. 1, the auxiliary shielding coil 6 is arranged at the respective interior surfaces of the walls of the cargo space 2. Within the scope of the invention, however, the auxiliary shielding coil can also be arranged at the outside circumferential surface of the magnet 4. Further embodiments of the invention allow the auxiliary shielding coil to be integrated in the walls of the cargo space 2 or to fashion the wall of the cargo space 2 as auxiliary shielding coil.

The auxiliary shielding coil 6 of the mobile nuclear magnetic resonance apparatus 1 shown in FIG. 1 is fabricated of electrically conductive material, preferably copper. During travel, a generator (not shown in FIG. 1) generates the required constant current. Since the auxiliary shielding coil 6 is not active during the imaging measurements, only the stray field (the part of the magnetic field outside the patient tube that does not contribute to imaging) has to be taken into consideration for the optimization of the auxiliary shielding coil 6.

Figure 2:
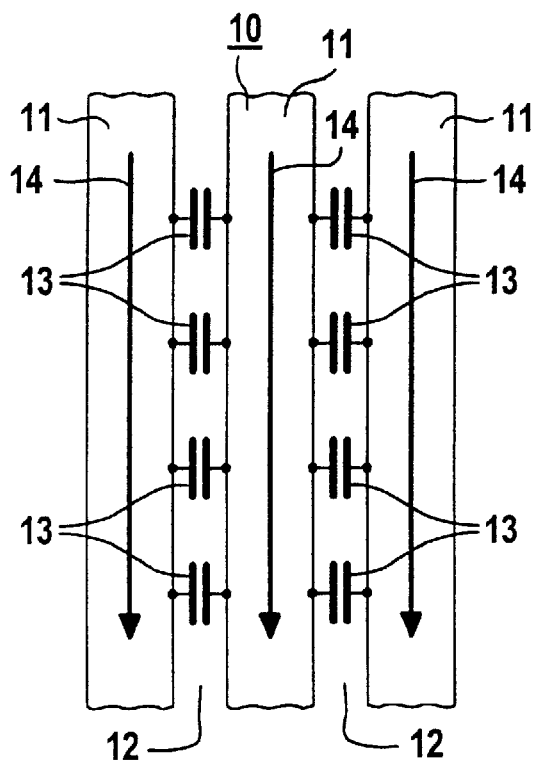
FIG. 2 shows a portion of an auxiliary shielding coil with integrated radio-frequency shielding in accordance with the invention.

The mobile nuclear magnetic resonance apparatus 1, just like a stationary nuclear magnetic resonance apparatus, must be shielded against radio-frequency fields. Within the scope of the invention, it is therefore possible to integrate radio-frequency shielding into the auxiliary shielding coil of the nuclear magnetic resonance apparatus 1. FIG. 2 shows one possibility for doing this.

In FIG. 2, an auxiliary shielding coil 10 has conductors 11 spaced from one another. The gaps 12 between two neighboring conductors 11 of the auxiliary shielding coil are shorted by respective capacitors 13 in the illustrated exemplary embodiment.

As a result of the structuring of the auxiliary shielding coil 10 shown in FIG. 2, a DC path arises that generates the compensating magnetic field. The corresponding flow of current in the conductors 11 is respectively identified with an arrow 14.

The capacitors 13 form the short-circuit path for the radio-frequency pulses, so that the auxiliary shielding coil 10 is also impermeable to radio-frequency pulses.

Although modifications and changes may be suggested by those skilled in the art, it is the intention of the inventor to embody within the patent warranted hereon all changes and modifications as reasonably and properly come within the scope of his contribution to the art.

I claim as my invention:

1. In a mobile nuclear magnetic resonance apparatus wherein a basic magnetic field is generated, and having a shielding arrangement including at least one primary shielding coil, the improvement comprising:

said shielding arrangement additionally comprising at least one auxiliary shielding coil for shielding said basic magnetic field, said at least one auxiliary shielding coil being selectively activatable at least during transport of said nuclear magnetic resonance apparatus.

2. A mobile nuclear magnetic resonance apparatus as claimed in claim 1 wherein said auxiliary shielding coil comprises a superconducting coil charged to a predetermined field strength before transport and de-excited by a predetermined value after transport.

3. A mobile nuclear magnetic resonance apparatus as claimed in claim 2 wherein said auxiliary shielding coil comprises a shielding coil for shielding against field disturbances during a measurement using said mobile nuclear magnetic resonance apparatus.

4. The improvement of claim 1 wherein said auxiliary shielding coil is comprised of electrically conductive material charged with direct current during transport.

5. The improvement of claim 4 wherein said electrically conductive material comprises material selected from the group consisting of copper and aluminum.

6. The improvement of claim 1 further comprising radio-frequency shielding integrated into said auxiliary shielding coil, said radio-frequency shielding comprising a plurality of neighboring conductors with gaps respectively therebetween, and at least one capacitor respectively connected between neighboring conductors in the respective gaps.

7. The improvement of claim 1 wherein said mobile nuclear magnetic resonance apparatus includes a basic field magnet having an outer circumferential surface, and wherein said auxiliary shielding coil is disposed at said outer circumferential surface of said magnet.

8. The improvement of claim 1 further comprising a cargo space of a transport vehicle, having walls, in which said mobile nuclear magnetic resonance apparatus is contained, and wherein said auxiliary shielding coil is integrated in said walls of said cargo space.

9. The improvement of claim 1 further comprising a cargo space of a transport vehicle, having walls with respective interior surfaces, in which said mobile nuclear magnetic resonance apparatus is contained, and wherein said auxiliary shielding coil is arranged at said interior surfaces of said walls.

10. The improvement of claim 1 further comprising a cargo space of a transport vehicle, having walls, in which said mobile nuclear magnetic resonance apparatus is contained, and wherein said walls of said cargo space comprise said auxiliary shielding coil.

\* \* \* \* \*